United States Patent
Cottet et al.

(10) Patent No.: US 11,018,109 B2
(45) Date of Patent: May 25, 2021

(54) POWER SEMICONDUCTOR MODULE WITH LOW GATE PATH INDUCTANCE

(71) Applicants: ABB Schweiz AG, Baden (CH); AUDI AG, Ingolstadt (DE)

(72) Inventors: Didier Cottet, Zürich (CH); Felix Traub, Birmenstorf (CH); Jürgen Schuderer, Zürich (CH); Andreas Apelsmeier, Pollenfeld (DE); Johann Asam, Adelzhausen (DE)

(73) Assignees: ABB Power Grids Switzerland AG, Baden (CH); Audi AG, Ingolstadt (DE)

( * ) Notice: Subject to any disclaimer, the term of this patent is extended or adjusted under 35 U.S.C. 154(b) by 0 days.

(21) Appl. No.: 16/442,923

(22) Filed: Jun. 17, 2019

(65) Prior Publication Data
US 2019/0304946 A1 Oct. 3, 2019

Related U.S. Application Data

(63) Continuation of application No. PCT/EP2017/082777, filed on Dec. 14, 2017.

(30) Foreign Application Priority Data

Dec. 16, 2016 (EP) .................................... 16204843

(51) Int. Cl.
*H01L 23/64* (2006.01)
*H01L 23/49* (2006.01)
(Continued)

(52) U.S. Cl.
CPC ........ *H01L 24/49* (2013.01); *H01L 23/49811* (2013.01); *H01L 23/645* (2013.01);
(Continued)

(58) Field of Classification Search
CPC . H01L 24/49; H01L 23/49811; H01L 23/645; H01L 25/072; H01L 2224/48091;
(Continued)

(56) References Cited

U.S. PATENT DOCUMENTS 6,906,404 B2 * 6/2005 Maly .................... H01L 25/072
257/678
7,342,262 B2 3/2008 Frey
(Continued)

FOREIGN PATENT DOCUMENTS

| EP | 2182551 A1 | 5/2010 |
|----|----|----|
| JP | 2013138234 A | 7/2013 |

(Continued)

OTHER PUBLICATIONS

European Patent Office, International Search Report & Written Opinion issued in corresponding Application No. PCT/EP2017/082777, dated Feb. 28, 2018, 9 pp.

*Primary Examiner* — Sheikh Maruf
(74) *Attorney, Agent, or Firm* — Slater Matsil, LLP

(57) ABSTRACT

A power semiconductor module, including a housing; a power semiconductor chip within the housing; power terminals protruding from the housing and electrically interconnected with power electrodes of the semiconductor chip; and auxiliary terminals protruding from the housing and electrically interconnected with a gate electrode and one of the power electrodes; wherein three auxiliary terminals are arranged in a coaxial auxiliary terminal arrangement, which comprises an inner and two outer auxiliary terminals, which are arranged on opposing sides of the inner auxiliary terminal. The inner auxiliary terminal is electrically interconnected with the gate electrode or one of the power electrodes (Continued)

and the two outer auxiliary terminals are electrically connected with the other one of the gate electrode and the one of the power electrodes.

27 Claims, 2 Drawing Sheets

(51) Int. Cl.
*H01L 23/00* (2006.01)
*H01L 25/07* (2006.01)
*H01L 23/498* (2006.01)

(52) U.S. Cl.
CPC .... *H01L 25/072* (2013.01); *H01L 2224/0603* (2013.01); *H01L 2224/48091* (2013.01); *H01L 2224/49111* (2013.01); *H01L 2924/19107* (2013.01); *H01L 2924/30107* (2013.01)

(58) Field of Classification Search
CPC . H01L 2224/49111; H01L 2924/19107; H01L 2924/30107
USPC .......................................... 438/690; 257/690
See application file for complete search history.

(56) References Cited

U.S. PATENT DOCUMENTS

| | | | | |
|---|---|---|---|---|
| 2005/0161785 A1* | 7/2005 | Kawashima | ............ | H01L 24/73 257/678 |
| 2005/0218500 A1* | 10/2005 | Frey | ............ | H01L 23/66 257/690 |
| 2006/0001146 A1* | 1/2006 | Passe | ............ | H01L 25/072 257/690 |
| 2006/0076660 A1* | 4/2006 | Boschlin | ............ | H01L 23/49562 257/678 |
| 2006/0151868 A1* | 7/2006 | Zhu | ............ | H01L 24/49 257/690 |
| 2006/0249831 A1* | 11/2006 | Connah | ............ | H01L 23/4824 257/690 |
| 2008/0246137 A1* | 10/2008 | Mahler | ............ | H01L 24/40 257/690 |
| 2010/0059875 A1* | 3/2010 | Sato | ............ | H01L 24/36 257/690 |
| 2010/0230790 A1* | 9/2010 | Disney | ............ | H01L 23/49589 257/666 |
| 2011/0115068 A1* | 5/2011 | Hartung | ............ | H01L 24/37 257/690 |
| 2012/0146205 A1* | 6/2012 | Fernando | ............ | H01L 24/32 257/677 |
| 2012/0221759 A1* | 8/2012 | Yokouchi | ............ | H01L 23/4824 710/306 |
| 2013/0015496 A1* | 1/2013 | Konno | ............ | H01L 29/417 257/140 |
| 2013/0093046 A1* | 4/2013 | Bayerer | ............ | H01L 24/49 257/532 |
| 2013/0105960 A1* | 5/2013 | Jones | ............ | H01L 25/07 257/690 |
| 2013/0105961 A1* | 5/2013 | Jones | ............ | H01L 23/24 257/691 |
| 2013/0286618 A1* | 10/2013 | Shibasaki | ............ | H01L 23/049 361/772 |
| 2014/0167241 A1* | 6/2014 | Matsuoka | ............ | H01L 23/24 257/690 |
| 2014/0361419 A1* | 12/2014 | Xue | ............ | H01L 24/17 257/676 |
| 2015/0155797 A1* | 6/2015 | Okayama | ............ | H02M 7/003 363/131 |
| 2015/0287665 A1* | 10/2015 | Hanada | ............ | H01L 25/115 257/691 |
| 2016/0093589 A1* | 3/2016 | Sato | ............ | H01L 23/049 257/690 |
| 2016/0126154 A1* | 5/2016 | Hoehn | ............ | H01L 23/49894 257/693 |
| 2016/0351505 A1* | 12/2016 | Tamada | ............ | H01L 25/072 |

FOREIGN PATENT DOCUMENTS

| | | | | |
|---|---|---|---|---|
| WO | 2013089242 A1 | 6/2013 | | |
| WO | WO-2013089242 A1 * | 6/2013 | ....... | H01L 23/49575 |

* cited by examiner

POWER SEMICONDUCTOR MODULE WITH LOW GATE PATH INDUCTANCE

FIELD OF THE INVENTION

The invention relates to the field of packaging of power semiconductors. In particular, the invention relates to a power semiconductor module.

BACKGROUND OF THE INVENTION

Power semiconductor modules may be employed in many applications, such as high power converters for electrical drives, traction applications, electrical road vehicles, etc. Usually, a power semiconductor module has several power terminals for conducting the current, which is switched by the power semiconductor module and auxiliary terminals, which may conduct a gate signal to the gate electrodes of one or more power semiconductor chips in the module. The gate signal may be provided by an external gate driver. The auxiliary terminals may include a gate terminal connected to the gate electrode and an auxiliary emitter terminal connected to the emitter of the power semiconductor module. The gate terminal, auxiliary emitter terminal and further conductors inside the power semiconductor module may form a gate path through the power semiconductor module. The stray inductance of the gate path or gate circuit may limit the switching accuracy and switching speed of the power semiconductor module.

One reason for this may be that the stray inductance limits the initial rise of the gate current. This may increase in particular the switching delay time, i.e., the time needed for the gate voltage to reach a threshold voltage. Furthermore, the stray inductance L of the gate circuit in series with the gate-emitter capacitance C may form a resonant circuit. This resonant circuit usually has to be damped by introduction of a gate resistor of value $R>2\sqrt{L/C}$. The larger gate resistor may slow down the switching transitions, i.e., resulting in increased switching delay time, commutation time and, thereby, increased switching losses. Additionally, an underdamped resonant circuit in the gate circuit may lead to increased tendency for uncontrolled oscillations in the gate circuit. In particular, the gate voltage may exhibit voltage overshoots during switching, which may degrade the gate oxide. Finally, the stray inductance can couple to external magnetic fields and induce unwanted gate-emitter voltages, affecting the switching performance.

For example, the inductance of the gate circuit may be lowered by wide conductor areas, since wide conductors need a very low current density in order to carry significant current. At the same time, the magnetic field may have a very long effective path, leading to a low inductance.

Another possibility is to use a stripline design, in which gate and auxiliary emitter conductor are placed in close proximity, which may lead to a cancellation of the magnetic fields of the two conductors. Therefore, such an arrangement may have a very low stray inductance. The two conductors may be isolated using solid isolation to minimize as much as possible the distance between the conductors.

Furthermore, one has to distinguish between distribution of the gate signal inside the power module and the external connections. Inside the power module, the gate and auxiliary emitter signal may be transported on wide conductors formed, e.g., as stacked layers of a substrate-based material, such as PCB or DBC, forming a low inductive arrangement. On the other hand, the external gate terminals may be formed by vertical terminals with screw connectors (typically for high-power semiconductor modules) or by press-pins (typically for power semiconductor modules of less power) or by upward bended leadframes (typically for transfer molded modules).

The auxiliary terminals alone usually have a comparable high stray inductance, since instead of being short and wide conductors, they are long and narrow in order to save space and to enable the press-in connection. Furthermore, they are spaced much farther apart than needed for the low voltage between them for making them more robust (for example in polluted environments) and for accounting for the space needed for the screw or press connection on the receiving gate driver board.

U.S. Pat. No. 7,342,262 B2 relating to a split-gate power module for suppressing oscillation describes an internal gate circuit layout and dimensioning the length of gate wire bonds for paralleling of dies in a module.

EP 2 182 551 A2 relates to a connection arrangement for semiconductor power modules and describes an optimal terminal arrangements for power modules with multiple substrates.

WO 2013/089 242 A1 shows a power semiconductor module, which comprises a three-phase active rectifier. A terminal arrangement for three chips is provided by six equidistant terminals. Two of the terminals are electrically connected to the same potential and sandwich a gate terminal in between them.

JP 2013 138 234 A shows a power semiconductor module with several chips on one substrate.

DESCRIPTION OF THE INVENTION

It is an objective of the invention to provide a power semiconductor module with a low gate path inductance.

This objective is achieved by the subject-matter of the independent claim. Further exemplary embodiments are evident from the dependent claims and the following description.

The invention relates to a power semiconductor module. A power semiconductor module may be a device, which mechanically and electrically interconnects one or more power semiconductor chips with electrical conductors and terminals, such that the power semiconductor module can be used as a building block for larger machines, such as rectifiers, inverters, electrical drives, etc. In particular, the power semiconductor module may be used in an electrical inverter of an electrical or hybrid vehicle, i.e., for generating an AC current for an electrical motor from a DC current from a battery.

The term "power" in power semiconductor module and/or power semiconductor chip may relate to the ability to process currents of more than 10 A and/or more than 100 V.

According to an embodiment of the invention, the power semiconductor module comprises a housing; at least two power semiconductor chips within the housing; power terminals protruding from the housing and electrically interconnected with power electrodes of the semiconductor chips; and auxiliary terminals protruding from the housing and electrically interconnected with gate electrodes of the semiconductor chips and the power electrodes of the semiconductor chips.

The housing may be made of a plastics material, into which the at least two power semiconductor chips, a substrate, onto which the at least two power semiconductor chips are bonded and to which the terminals are connected, and the terminals are embedded. The power terminals may be electrical conductors, for example made of a leadframe, which protrude from the housing. Also, the auxiliary terminals may be electrical conductors, for example made of the same or a different leadframe, which protrude from the housing. The power terminals may have a larger cross-section than the auxiliary terminals.

The power semiconductor chips may be based on a wide-bandgap material, such as SiC, and/or may comprise a thyristor or transistor. In the case of a thyristor, the power electrodes provide an anode and a cathode. In the case of an IGBT, the power electrodes provide an emitter and a collector. In the case of a MOSFET, the power electrodes provide a drain and a source. In the following it will be assumed that the power semiconductor chips houses an IGBT and that one of the auxiliary terminals is connected to the emitter, i.e., is an auxiliary emitter terminal. However, it is also possible that the auxiliary terminal(s) connected to the power electrode is/are connected to a collector, anode, cathode, drain and source, respectively.

Three auxiliary terminals are arranged in at least two coaxial auxiliary terminal arrangements. Each coaxial terminal arrangements comprises an inner auxiliary terminal and two outer auxiliary terminals, which are arranged on opposing sides of the inner auxiliary terminal, wherein the inner auxiliary terminal is electrically interconnected with the gate electrode of one or more semiconductor chips or one of the power electrodes of one or more power semiconductor chips and the two outer auxiliary terminals are electrically connected with the other one of the gate electrode and the one of the power electrodes.

In a first embodiment, the inner auxiliary terminal is electrically interconnected with a gate electrode and the two outer auxiliary terminals are electrically connected with a power electrode, such as the emitter electrode or the source electrode.

In a second embodiment, the inner auxiliary terminal is electrically interconnected with a power electrode, such as the emitter electrode or the source electrode, and the two outer auxiliary terminals are electrically connected with a gate electrode.

In both cases, the two outer auxiliary terminals are electrically connected with each other and/or have at least three auxiliary terminals.

In general, the gate terminal or the auxiliary emitter is split into two auxiliary terminals, which sandwich the other ones of the terminals between them. One of the gate control terminals (gate terminal and auxiliary emitter terminal) may have been split into two terminals, such that two gate terminals and one auxiliary emitter terminal or two auxiliary emitter terminals and one gate terminal protrude from the housing, and are arranged in such a way, that one terminal is surrounded on both sides by one terminal of opposite polarity each.

Simulations and tests have been shown that a coaxial arrangement of the auxiliary terminals results in a lower stray inductivity than, for example, only using two auxiliary terminals having the same width as coaxial terminal arrangement.

According to an embodiment of the invention, the two outer auxiliary terminals are arranged axially symmetric with respect to the inner auxiliary terminal. This may be seen as a definition for coaxial terminals. The two outer auxiliary terminals may have the same distance to the inner auxiliary terminal.

According to an embodiment of the invention, a distance between two coaxial terminal arrangements is larger than a distance between the auxiliary terminals of one coaxial terminal arrangement. It may be that the auxiliary terminals of one coaxial terminal arrangement are separated from the auxiliary terminal arrangement of another coaxial terminal arrangement. A gap between the two coaxial terminal arrangements may be larger than a gap between the auxiliary terminals of one coaxial terminal arrangement. For example, one or more power terminals may be arranged between the two coaxial terminal arrangements.

According to an embodiment of the invention, the terminals of at least one of the coaxial terminal arrangements are arranged coaxially outside of the housing and/or are arranged coaxially inside of the housing. It may be that the terminals of at least one of the coaxial terminal arrangement are substantially parallel along their complete extension.

According to an embodiment of the invention, the three terminals of at least one of the coaxial terminal arrangements are electrically connected to a first metallization layer and a second metallization layer, which are separate from metallization layers to which the power electrodes are bonded. The metallization layers all may be provided by a substrate, such as a DBC (direct bonded copper) substrate. The gate first and second metallization layers, for example, may provide an auxiliary emitter path separate from the main emitter path. This auxiliary emitter path may be galvanically decoupled from the power currents through the main emitter path (for example by a separate wire bond from the power semiconductor chip to the second metallization layer).

According to an embodiment of the invention, the first metallization layer and the second metallization layer provide conducting paths, which are running side by side. The auxiliary emitter path at least in sections may be placed close to the gate path. This also may contribute to a gate circuit with low stray inductance.

According to an embodiment of the invention, the three terminals of at least one of the coaxial terminal arrangements are electrically connected to three metallization layers on a substrate of the power semiconductor module, which three metallization layers are arranged coaxially with each other. The coaxial arrangement of the gate path and the emitter path may be continued inside the power semiconductor module, with three coaxially arranged conductors, such as metallization layers in a substrate.

According to an embodiment of the invention, the three terminals of at least one of the coaxial terminal arrangements are electrically connected with conductors and/or metallization layers inside the housing, which conductors and/or metallization layers are interconnected with wire bonds. The conductors and/or metallization layers may be seen as gate conductors and auxiliary emitter conductors. Also the wire bonds interconnecting these conductors may be arranged in a coaxial way. Three sets of wire bonds may be arranged side by side, wherein the outer two sets are connected with a complementary potential as the potential of the inner set.

The wire bonds may be distributed into an inner set of wire bonds and two outer sets of wire bonds, which are arranged on opposing sides of the inner set of wire bonds, wherein the inner set of wire bonds is electrically interconnected with the gate electrode or one of the power electrodes and the two outer sets of wire bonds are electrically connected with the other one of the gate electrode and the one of the power electrodes.

The interconnection between pairs of gate/auxiliary emitter conductors on different metallization layers may be realized by an arrangement of three sets of wire bonds. Each set may comprise at least one wire bond. The sets of wire bonds may be arranged in such a way that a single set of wire bonds for one potential (i.e., gate potential or auxiliary emitter potential) is surrounded on each side by one set of wire bonds of complementary potential (i.e., auxiliary emitter potential or gate potential, respectively).

According to an embodiment of the invention, the wire bonds interconnect metallization layers on different substrates. For example, the auxiliary terminal may be bonded to a main substrate, to which also the one or more power semiconductor chips are bonded. The gate and auxiliary emitter path may be provided by metallization layers on an additional substrate that is bonded to the main substrate. Both substrates may be DBC substrates and/or PCBs.

Additional metallization layers, which may be realized by an additional DBC or PCB layer, may serve as conductors for the power currents (i.e., collector or emitter currents of the power semiconductor devices).

The auxiliary terminals may be attached to the metallization layers inside the power semiconductor module by soldering or welding. The metallization layers may be on the same vertical level, however, they may also be shifted vertically with respect to each other.

According to an embodiment of the invention, metallization layers electrically interconnected with the auxiliary terminals are provided on the same substrate as metallization layers electrically interconnected with power terminals. For example, the auxiliary emitter conductor may coincide in part with the power emitter metallization layer on the main substrate or on an additional substrate.

According to an embodiment of the invention, at least one of the coaxial auxiliary terminal arrangements comprises at least a first, second, third and fourth auxiliary terminal, which are arranged one after the other, such that the second auxiliary terminal is arranged between the first and third auxiliary terminal and the third auxiliary terminal is arranged between the second and fourth auxiliary terminal. At least one of the coaxial terminal arrangements may be a more general interleaved arrangement, wherein at least two gate terminals are interleaved with at least two auxiliary power electrode (emitter) terminals.

The first and the third auxiliary terminal may be electrically interconnected with the gate electrode or one of the power electrodes and the second and the third auxiliary terminal may be electrically connected with the other one of the gate electrode and the one of the power electrodes.

According to an embodiment of the invention, the power terminals and/or the auxiliary terminals are manufactured from one or more leadframes. In particular, the auxiliary gate control terminals may be realized by planar leadframe terminals. Planar leadframe terminals may be used in transfer molded power semiconductor modules or discrete power semiconductor modules.

The one or more leadframes may be made of a copper plate. After molding, the power terminals and/or the auxiliary terminals may be finished by cutting out ridges between the terminals.

According to an embodiment of the invention, the housing is provided by plastics material, in which the at least two power semiconductor chips, the power terminals and the auxiliary terminals are molded. For transfer molded power semiconductor modules, the additional leadframe terminals may come basically at zero cost, since leadframes are typically cut-out from a metal plate and cutting out less material may not increase costs.

According to an embodiment of the invention, the power terminals and/or the auxiliary terminals protrude from the housing at the same level or layer. This may be the case, when the terminals are made from one or more leadframes bonded to a main substrate of the power semiconductor module. The terminals of at least one of the coaxial terminal arrangements may be realized on the same vertical level and/or may leave the housing on the same vertical level. However, when the power semiconductor module has more than one coaxial terminal arrangement, the terminals of different coaxial terminal arrangements may be arranged on different vertical level and/or may leave the housing on different vertical levels.

According to an embodiment of the invention, the auxiliary terminals are bent, such that their tips point in a direction orthogonal to a direction in which the auxiliary terminals protrude from the housing. For example, the terminals may be bent, such that they are L-shaped, wherein one arm of the L is bonded to a substrate inside the housing and protrudes from the housing and a second arm runs substantially orthogonal to the above mentioned vertical level(s).

According to an embodiment of the invention, the at least one power semiconductor chip is bonded to a substrate to which the power terminals and/or the auxiliary terminals are bonded. The one or more power semiconductor chips may be assembled in a substrate-based carrier, such as a Direct-Bond-Copper (DBC) substrate or Printed-Circuit-Board (PCB). This main substrate may be complemented by additional metallization layers, separated vertically from the main substrate, which serve for distribution of gate signals to coaxial or interleaved auxiliary terminals. The additional metallization layers may be provided by an additional substrate.

According to an embodiment of the invention, the power semiconductor module comprises a first, main substrate to which the at least one power semiconductor chip is bonded and a second, additional substrate bonded to the main substrate. Metallization layers on the second substrate may be electrically connected with the auxiliary terminals of at least one of the coaxial auxiliary terminal arrangements. The second, additional substrate may serve for distributing the gate signals inside the power semiconductor module and/or for providing gate circuit paths. On the second, additional substrate, the metallization layers, which are electrically connected with the gate electrode and/or the respective power electrode, may run substantially in parallel and/or may be aligned in a coaxial way.

According to an embodiment of the invention, the power semiconductor module comprises power semiconductor chips, which are electrically interconnected into one or more half-bridges for converting a DC current into an AC current. For example, the power semiconductor module may comprise a phase or all phases of an inverter used in an electrical or hybrid vehicle, in particular a car. The power semiconductor module may comprise two or more coaxial terminal arrangements, which are all may be made as described above and the below.

It may be that a first coaxial terminal arrangement is provided for a first half of a half-bridge and a second coaxial terminal arrangement is provided for a second half of a half-bridge. All gates of the first half of the half-bride may be interconnected with an auxiliary terminal of the first coaxial terminal arrangement. All gates of the second half of the half-bride may be interconnected with an auxiliary terminal of the second coaxial terminal arrangement.

Summarized, the stray inductance of a gate circuit of a power semiconductor module may be decreased, using specially aligned auxiliary terminals, which may be made from a planar leadframe. The auxiliary terminals are arranged coaxially wherein one auxiliary terminal (gate or auxiliary emitter terminal) is sandwiched between two complementary auxiliary terminals (i.e., auxiliary emitter or gate terminal, respectively). This coaxial auxiliary terminal arrangement may be combined with a gate distribution circuit realized by an additional substrate, such as an additional DBC substrate. Also wire bonds interconnecting this additional substrate with the main substrate may be arranged in a coaxial way further lowering the stray inductance of the gate circuit.

These and other aspects of the invention will be apparent from and elucidated with reference to the embodiments described hereinafter.

BRIEF DESCRIPTION OF THE DRAWINGS

The subject-matter of the invention will be explained in more detail in the following text with reference to exemplary embodiments which are illustrated in the attached drawings.

The reference symbols used in the drawings, and their meanings, are listed in summary form in the list of reference symbols. In principle, identical parts are provided with the same reference symbols in the figures.

DETAILED DESCRIPTION OF EXEMPLARY EMBODIMENTS

Figure 1:
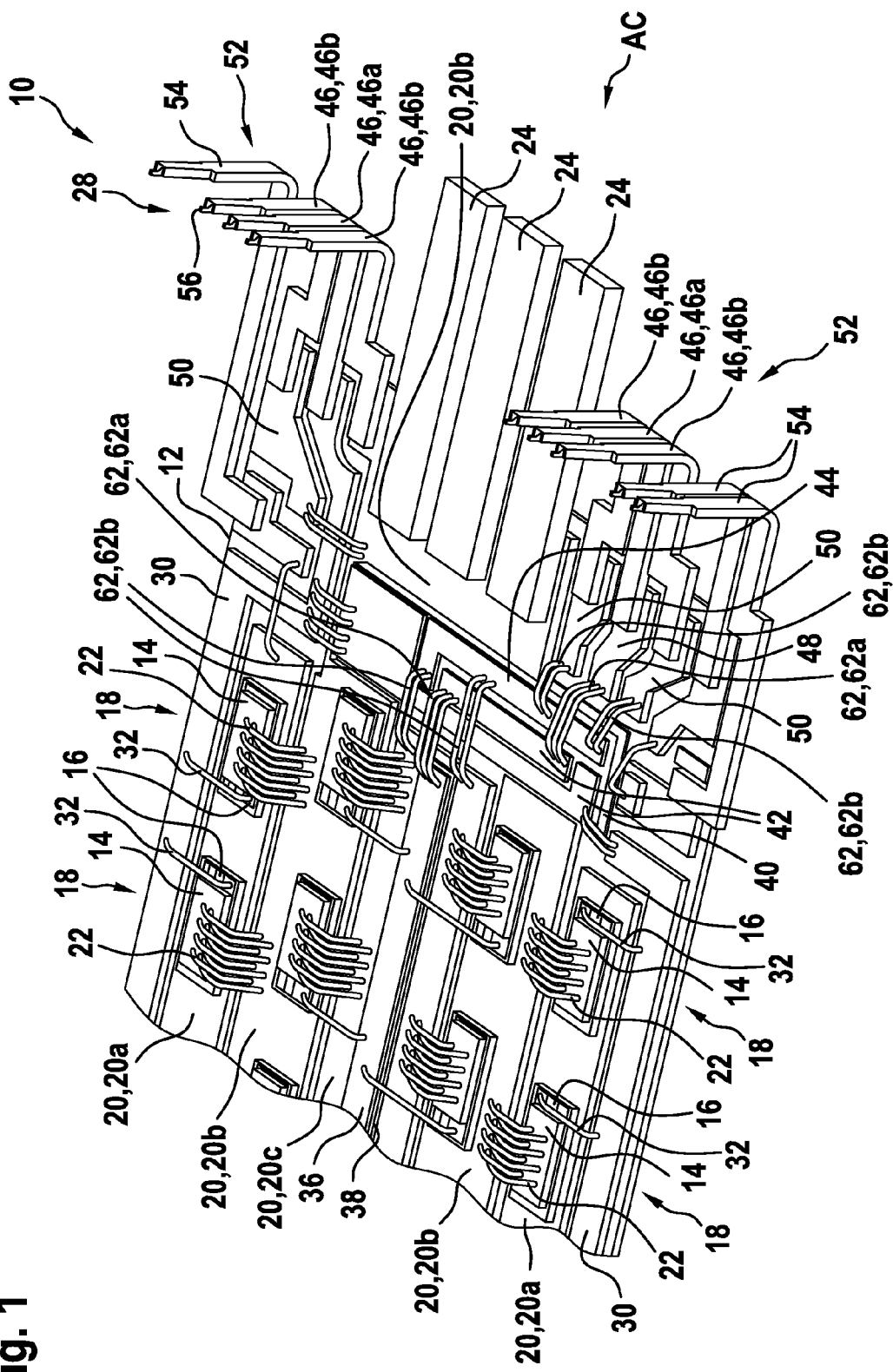
FIG. 1 shows a perspective view of a part of a power semiconductor module according to the invention without a housing.

FIG. 1 shows a power semiconductor module 10, which comprises a main substrate 12 to which several power semiconductor chips 14 are bonded. For example, each of the semiconductor chips 14 provides a thyristor, IGBT, MOSFET or other semiconductor switch, which comprises a gate electrode 16 and two power electrodes 18, such as an emitter or a collector in the case of a thyristor or IGBT.

With one power electrode 18, the power semiconductor chips 14 are bonded to several metallization layers 20 of the main substrate 12. The other power electrode 18 is connected to a set of wire bonds 22, which electrically interconnect the respective power semiconductor chip 14 with a metallization layer 20 on the main substrate 12 different from the metallization layer 20 to which the respective power semiconductor chip 14 is bonded.

Figure 2:
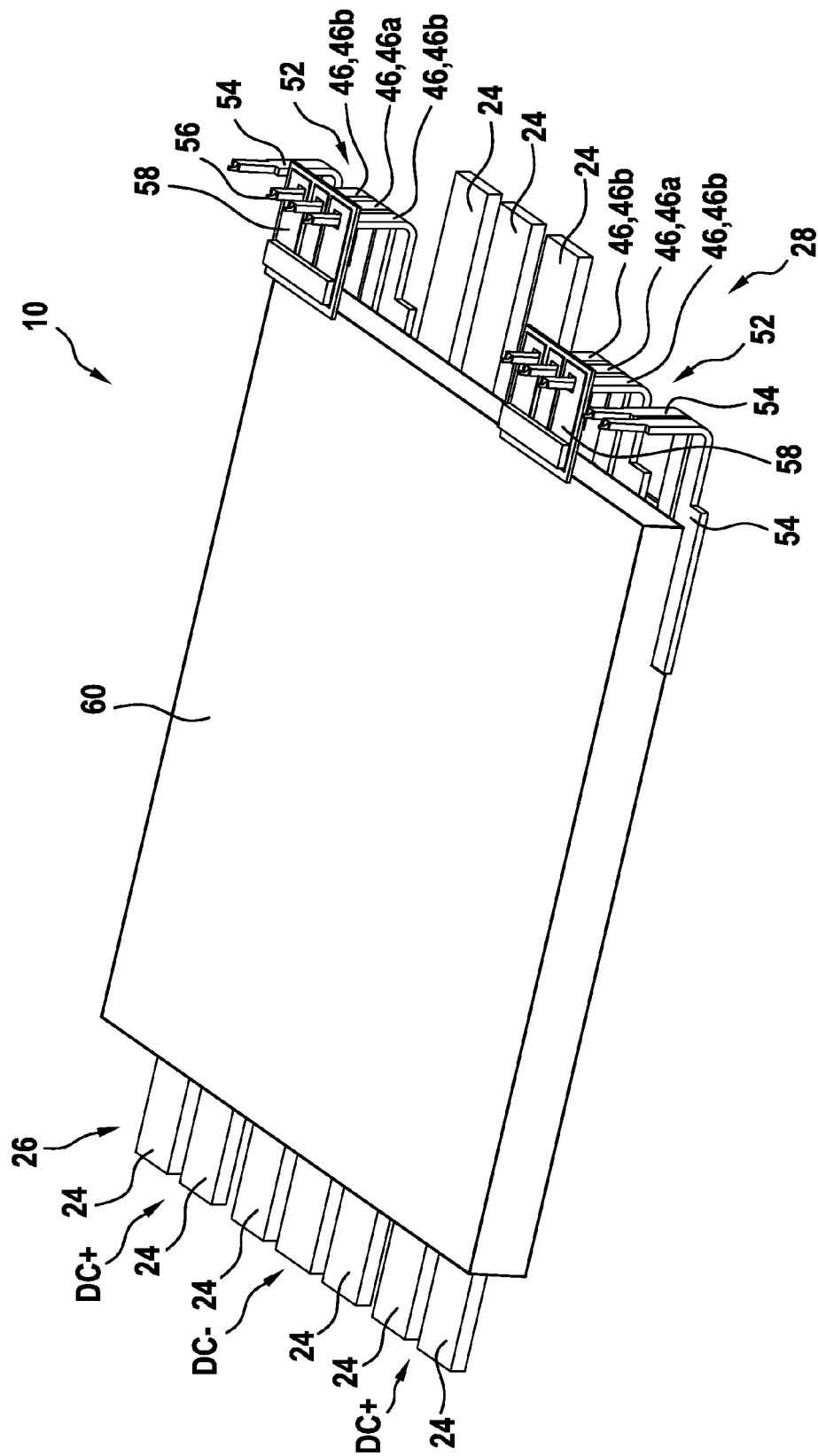
FIG. 2 shows a perspective view of the power semiconductor module of FIG. 1 with the housing.

With respect to FIG. 2, the power semiconductor module 10 furthermore comprises power terminals 24, which are bonded to the metallization layers 20 on the main substrate 12 and which provide external connections for DC+, DC− and AC. For every one of DC+, DC− and AC, there are two or more power terminals 24, which are bonded to the same metallization layer 20. The power terminals 24 for DC+ and DC− are substantially parallel and protrude from the substrate 12 at a first side 26 of the power semiconductor module 10. Furthermore, the power terminals 24 for one of DC− and DC+ are arranged between the power terminals 24 for the other one of DC− and DC+ to provide a coaxial connection for DC+ and DC−. The power terminals 24 for AC are substantially parallel and protrude from the substrate 12 at a second side 28 of the power semiconductor module 10, which is opposite from the first side 26.

Returning to FIG. 1, the semiconductor chips 14 are electrically interconnected into a half-bridge, wherein the semiconductor chips 14, which are connected to two outer metallization layers 20, 20a, provide a first arm of the half-bridge and the semiconductor chips 14, which are connected to an intermediate metallization layer 20, 20b, provide a second arm.

The main substrate 12 also carries metallization layers 30, which are used for distributing gate signals. The gate electrodes 16 of the semiconductor chips 14 of one of the arms of the half-bridge are connected with a wire bond 32 to these metallization layers 30. The gate electrodes 16 of the semiconductor chips 14 of the other arm of the half-bridge are connected with a wire bond 32 to a metallization layer 36 of a substrate 38 mounted to an inner metallization layer 20 on the main substrate 12, which is arranged within the intermediate metallization layer 20, 20b.

A further substrate 40 is mounted to the intermediate metallization layer 20, 20b, which substrate 40 carries metallization layers 42 for distributing gate signals and a metallization layer 44 for distributing an auxiliary emitter signal.

The main substrate 12 and the substrates 38, 40 may be DBC substrates.

On the second side 28, the power semiconductor module comprises auxiliary terminals 46, which are partially bonded to further metallization layers 48, 50 of the main substrate 12. The metallization layer 48 is used for distributing a gate signal. The metallization layers 50 are used for distributing an auxiliary emitter signal.

The auxiliary terminals 46 are arranged in two coaxial auxiliary terminal arrangements 52, which are arranged on both sides of the AC power terminals 24. Each of the coaxial auxiliary terminal arrangements 52 comprises an inner auxiliary terminal 46a and two outer auxiliary terminals 46b, which are arranged on opposing sides of the inner auxiliary terminal 46a. In the embodiment of FIG. 1, the inner auxiliary terminal 46a is a gate terminal, while the outer auxiliary terminals 46b are auxiliary emitter terminals.

Furthermore, there may be auxiliary terminals 54 for an auxiliary DC connection for connecting a temperature sensor, which also may be bonded to metallization layers on the main substrate 12.

The power terminals 24 may be made of a first leadframe, wherein the auxiliary terminals 46, 54 may be made of a second leadframe, which may be thinner than the first leadframe.

The auxiliary terminals 46, 54 are bent, such that their tips 56 points in a direction orthogonal to a direction in which the auxiliary terminals 46, 54 and the power terminals 24 protrude from the main substrate 12. The tips 56 may be formed as compressible press-fit tips, onto which a PCB 58, which may carry a gate driver, may be pressed.

FIG. 2 shows the power semiconductor module 10 with its housing 60, into which the power semiconductor chip 14, the substrates 12, 38, 40, the wire bonds 22, 32 and inner parts of the terminals 24, 46, 54 are molded, for example via resin transfer molding.

Outer parts of the power terminals 24 and the auxiliary terminals 46, 56 protrude from the housing at the same level.

Returning to FIG. 1, the power semiconductor module 10 has gate circuits with very low stray inductance, which is caused by the coaxial auxiliary terminal arrangements 52 and further measures, such as parallel running gate conductors 42, 48 and emitter conductors 44, as well as coaxial arranged wire bonds (see below).

The auxiliary terminals 46a, 46b of the coaxial auxiliary terminal arrangements 52 are running substantially parallel along their extension, an inner auxiliary terminal 46a, which is electrically connected to a first potential (here, the gate voltage) is sandwiched between two outer auxiliary terminals 46b, which are electrically connected to a second potential (here, the emitter voltage). It also may be possible that the two outer auxiliary terminals 46b are electrically connected to the first potential and that the inner auxiliary terminal is electrically connected to the second potential.

The auxiliary terminals 46a, 46b run coaxially outside of the housing 60 and inside of the housing 60. The coaxial arrangement of electrical conductors may be continued inside of the semiconductor module 10, i.e., inside of the housing 60. In particular, the parts of the metallization layers 20, 50 to which the outer terminals 46b are attached, and the metallization layers 30, 48, to which the terminals 46a are attached, also may run side by side, i.e., may be arranged coaxially.

Furthermore, for better decoupling the gate circuit from the power circuit, it may be possible to provide separate current paths for the gate conductors and the auxiliary current conductors. For example, the metallization layers 48, 50, to which the lower coaxial auxiliary terminal arrangement 52 is attached, are metallization layers 48, 50 on the main substrate but disconnected from the metallization layers 20 for conducting the power currents.

The metallization layers 48, 50 are only connected to these layers and/or the semiconductor chips via wire bonds 62. These wire bonds 62 are arranged in coaxial sets of wire bonds 62, which are used for electrically connecting the main substrate 12 with the substrate 40 and/or the substrate 38. The set of wire bonds 62 are running substantially parallel between their connection points. An inner set of wire bonds 62a, which is electrically connected to a first potential (here, the gate voltage), is sandwiched between two outer sets of wire bonds 62b, which are electrically connected to a second potential (here, the emitter voltage). It also may be possible that the two outer sets of wire bonds 62b are connected to the first potential and that the inner set of wire bonds 62a is connected to the second potential.

In such a way, the coaxial design approach is also used for wire bonds 62 between different gate distribution substrates 38, 40 and/or between the main substrate 12 and a gate distribution substrate 40. With the gate distribution substrates 38, 40 stacked onto the main substrate 12, the wire bond connection provided by the wire bonds 62 may be designed in a short and flexible way.

As shown with the substrate 40, also the current path for the auxiliary emitter may be provided on an additional substrate. The metallization layer 44 on the substrate 40 for the auxiliary emitter runs parallel and/or side by side with the metallization layer 42 on the substrate 40 for the gate.

Apart from having a very low stray inductance, this design is very robust to disturbances caused by the coupling to external magnetic fields. The gate circuit formed by one outer auxiliary terminal 46b and the inner auxiliary terminal 46a generates a first gate-emitter loop and the gate circuit formed by the other outer auxiliary terminal 46b and the inner auxiliary terminal 46a forms a second gate-emitter loop. Due to the symmetrical coupling of external magnetic fields into the two neighboring gate-emitter loops and due to their opposite orientation, the contributions from the two loops cancel. Therefore, the gate circuit is very robust to parasitic couplings from external time-variant magnetic fields, such as the magnetic fields during the commutating current dI/dt's in the same or in neighboring power semiconductor modules.

Additionally, for the connection of different gate distribution substrates 38, 40, the immunity to external magnetic fields is important to reduce the coupling between the gate circuit and the power circuit. Otherwise, the dI/dt of the commutating current in nearby conductors will lead to distortions of the imposed gate voltages. Thus, low coupling is realized, among others, by the coaxially arranged wire bonds 62.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art and practising the claimed invention, from a study of the drawings, the disclosure, and the appended claims. In the claims, the word "comprising" does not exclude other elements or steps, and the indefinite article "a" or "an" does not exclude a plurality. A single processor or controller or other unit may fulfil the functions of several items recited in the claims. The mere fact that certain measures are recited in mutually different dependent claims does not indicate that a combination of these measures cannot be used to advantage. Any reference signs in the claims should not be construed as limiting the scope.

LIST OF REFERENCE SYMBOLS 10 power semiconductor module
12 main substrate
14 power semiconductor chip
16 gate electrode
18 power electrode
20 metallization layer
20a outer metallization layer
20b intermediate metallization layer
20c inner metallization layer
22 wire bond
24 power terminals
26 first side
28 second side
30 metallization layer
32 wire bond
34 metallization layer
36 gate distribution substrate
38 gate distribution substrate
42 metallization layer
44 metallization layer
46 auxiliary terminals
46a inner auxiliary terminal, gate terminal
46b outer auxiliary terminal, auxiliary emitter terminal
48 metallization layer
50 metallization layer
52 coaxial auxiliary terminal arrangement
54 auxiliary terminal
56 press-fit tip
58 PCB
60 housing
62 set of wire bonds
62a inner set of wire bonds
62b outer set of wire bonds

The invention claimed is:
1. A power semiconductor module, comprising:
a housing;
at least two power semiconductor chips within the housing;
power terminals protruding from the housing and electrically interconnected with power electrodes of the semiconductor chips;

auxiliary terminals protruding from the housing and electrically interconnected with gate electrodes of the semiconductor chips and power electrodes of the semiconductor chips;
wherein the auxiliary terminals are arranged in at least first and second coaxial terminal arrangements, each coaxial terminal arrangement comprising an inner auxiliary terminal and two outer auxiliary terminals, which are arranged on opposing sides of the inner auxiliary terminal;
wherein a power terminal is located between the first coaxial terminal arrangement and the second coaxial terminal arrangement; and
wherein, for each coaxial terminal arrangement, the inner auxiliary terminal is electrically interconnected with the gate electrode or one of the power electrodes of one of the power semiconductor chips and the two outer auxiliary terminals are electrically connected with the other one of the gate electrode and the one of the power electrodes.

2. The power semiconductor module of claim 1, wherein the two outer auxiliary terminals of the coaxial terminal arrangements are arranged axially symmetric with respect to the inner auxiliary terminal of the respective coaxial terminal arrangement.

3. The power semiconductor module of claim 1,
wherein the auxiliary terminals of at least one of the coaxial terminal arrangements are arranged coaxially outside of the housing.

4. The power semiconductor module of claim 1,
wherein the auxiliary terminals of at least one of the coaxial terminal arrangements are electrically connected to a first metallization layer and a second metallization layer, which are separate from metallization layers to which the power electrodes are bonded; and
wherein the first metallization layer and the second metallization layer provide conducting paths, which are running side by side.

5. The power semiconductor module of claim 1,
wherein the auxiliary terminals of at least one of the coaxial terminal arrangements are electrically connected to three metallization layers on a substrate of the power semiconductor module, which three metallization layers are arranged coaxially with each other.

6. The power semiconductor module of claim 1,
wherein the auxiliary terminals of at least one of the coaxial terminal arrangements are electrically connected with conductors and/or metallization layers inside the housing, which conductors and/or metallization layers are interconnected with wire bonds;
wherein the wire bonds are distributed into an inner set of wire bonds and two outer sets of wire bonds, which are arranged on opposing sides of the inner set of wire bonds; and
wherein the inner set of wire bonds is electrically interconnected with the gate electrode or one of the power electrodes and the two outer sets of wire bonds are electrically connected with the other one of the gate electrode and the one of the power electrodes.

7. The power semiconductor module of claim 6, wherein the wire bonds interconnect metallization layers on different substrates.

8. The power semiconductor module of claim 1, wherein metallization layers electrically interconnected with the auxiliary terminals are provided on the same substrate as metallization layers electrically interconnected with power terminals.

9. The power semiconductor module of claim 1,
wherein at least one of the coaxial auxiliary terminal arrangements comprises at least a first, second, third and fourth auxiliary terminal, which are arranged one after the other, such that the second auxiliary terminal is arranged between the first and third auxiliary terminal and the third auxiliary terminal is arranged between the second and fourth auxiliary terminal; and
wherein the first and the third auxiliary terminal are electrically interconnected with the gate electrode or one of the power electrodes and the second and the third auxiliary terminal are electrically connected with the other one of the gate electrode and the one of the power electrodes.

10. The power semiconductor module of claim 1, wherein the housing is provided by plastics material, in which the at least two power semiconductor chips, the power terminals and the auxiliary terminals are molded.

11. The power semiconductor module of claim 1, wherein the power terminals and/or the auxiliary terminals protrude from the housing at the same level.

12. A power semiconductor module, comprising:
a housing;
a plurality of power semiconductor chips within the housing;
power terminals protruding from the housing and electrically interconnected with power electrodes of the semiconductor chips; and
auxiliary terminals protruding from the housing and electrically interconnected with gate electrodes of the semiconductor chips and power electrodes of the semiconductor chips;
wherein the auxiliary terminals are arranged as at least two coaxial terminal arrangements, each coaxial terminal arrangement comprising an inner auxiliary terminal and two outer auxiliary terminals, which are arranged on opposing sides of the inner auxiliary terminal;
wherein the inner auxiliary terminal is electrically interconnected with the gate electrode or one of the power electrodes of one of the power semiconductor chips and the two outer auxiliary terminals are electrically connected with the other one of the gate electrode and the one of the power electrodes;
wherein the power terminals protrude from the housing at the same level in a plane Parallel to an upper surface of the housing; and
wherein the auxiliary terminals are bent, such that their tips point in a direction orthogonal to a direction in which the auxiliary terminals protrude from the housing.

13. The power semiconductor module of claim 1, wherein the at least two power semiconductor chips are bonded to a substrate to which the power terminals and/or the auxiliary terminals are bonded.

14. The power semiconductor module of claim 1,
wherein the power semiconductor module comprises a main substrate to which the at least two power semiconductor chips are bonded and a second substrate bonded to the main substrate; and
wherein metallization layers on the second substrate are electrically connected with the auxiliary terminals of at least one of the coaxial auxiliary terminal arrangements.

15. The power semiconductor module of claim 1, wherein the at least two power semiconductor chips are electrically interconnected into one or more half-bridges for converting a DC current into an AC current.

16. The power semiconductor module of claim 7, wherein metallization layers electrically interconnected with the auxiliary terminals are provided on the same substrate as metallization layers electrically interconnected with power terminals.

17. A power semiconductor module, comprising:
- a housing having an upper surface, opposite first and second edges and opposite third and fourth edges;
- at least two power semiconductor chips within the housing;
- a plurality of DC+ terminals protruding from the first edge of the housing;
- a plurality of DC− terminals protruding from the first edge of the housing, each DC− terminal located adjacent a DC+ terminal to provide a coaxial connection for the DC+ and DC− terminals;
- an AC terminal protruding from the second edge of the housing;
- auxiliary terminals protruding from the housing and electrically interconnected with gate electrodes of the semiconductor chips and power electrodes of the semiconductor chips;
- wherein the auxiliary terminals are arranged in at least first and second coaxial terminal arrangements, each coaxial terminal arrangement comprising an inner auxiliary terminal and two outer auxiliary terminals, which are arranged on opposing sides of the inner auxiliary terminal; and
- wherein, for each coaxial terminal arrangement, the inner auxiliary terminal is electrically interconnected with the gate electrode or one of the power electrodes of one of the power semiconductor chips and the two outer auxiliary terminals are electrically connected with the other one of the gate electrode and the one of the power electrodes.

18. The power semiconductor module of claim 17, wherein the auxiliary terminals of at least one of the coaxial terminal arrangements are arranged coaxially outside of the housing.

19. The power semiconductor module of claim 17, wherein the auxiliary terminals of at least one of the coaxial terminal arrangements are electrically connected with conductors and/or metallization layers inside the housing, which conductors and/or metallization layers are interconnected with wire bonds;
wherein the wire bonds are distributed into an inner set of wire bonds and two outer sets of wire bonds, which are arranged on opposing sides of the inner set of wire bonds; and
wherein the inner set of wire bonds is electrically interconnected with the gate electrode or one of the power electrodes and the two outer sets of wire bonds are electrically connected with the other one of the gate electrode and the one of the power electrodes.

20. The power semiconductor module of claim 19, wherein the wire bonds interconnect metallization layers on different substrates.

21. The power semiconductor module of claim 17, wherein the power semiconductor module comprises a main substrate to which the plurality of semiconductor chips are bonded and a second substrate bonded to the main substrate; and
wherein metallization layers on the second substrate are electrically connected with the auxiliary terminals of at least one of the coaxial auxiliary terminal arrangements.

22. The power semiconductor module of claim 17, wherein a distance between the two coaxial terminal arrangements is larger than a distance between the auxiliary terminals of one of the coaxial terminal arrangements.

23. The power semiconductor module of claim 17, wherein the at least two power semiconductor chips comprise:
- a first plurality of power semiconductor chips, each power semiconductor chip of the first plurality having a gate electrode that is coupled to gate electrodes of the other semiconductor chip(s) of the first plurality; and
- a second plurality of power semiconductor chips, each power semiconductor chip each of the second plurality having a control electrode that is coupled to control electrodes of the other semiconductor chip(s) of the second plurality.

24. The power semiconductor module of claim 17, wherein the auxiliary terminals protrude from the second edge of the housing.

25. The power semiconductor module of claim 24, wherein the first coaxial terminal arrangement protrude from the second edge of the housing between the AC terminal and the third edge of the housing; and
wherein the second coaxial terminal arrangement protrude from the second edge of the housing between the AC terminal and the fourth edge of the housing.

26. The power semiconductor module of claim 1, wherein the auxiliary terminals of at least one of the coaxial terminal arrangements are arranged coaxially inside of the housing.

27. The power semiconductor module of claim 17, wherein the auxiliary terminals of at least one of the coaxial terminal arrangements are arranged coaxially inside of the housing.

* * * * *